United States Patent [19]

Büttner

[11] Patent Number: 4,783,815
[45] Date of Patent: Nov. 8, 1988

[54] MANUFACTURING MINIATURE HEARING AID HAVING A MULTI-LAYER CIRCUIT ARRANGEMENT

[75] Inventor: Gerhard Büttner, Grossenseebach, Fed. Rep. of Germany

[73] Assignee: Siemens Aktiengesellschaft, Berlin and Munich, Fed. Rep. of Germany

[21] Appl. No.: 119,719

[22] Filed: Nov. 12, 1987

[30] Foreign Application Priority Data

Nov. 18, 1986 [DE] Fed. Rep. of Germany ....... 3639402

[51] Int. Cl.[4] ...................... H04R 25/00; H05K 1/00; B44C 1/22; C23F 1/02
[52] U.S. Cl. ........................................ 381/68; 29/852; 156/634; 156/645; 156/656; 156/630; 156/902; 174/68.5; 361/398; 361/399; 381/68.7; 381/69; 427/96
[58] Field of Search ............... 156/629, 634, 645, 656, 156/659.1, 666, 630, 633, 901, 902; 29/831, 846, 852; 174/68.5; 361/397, 398–399, 412, 415, 400; 427/96, 97; 381/68, 68.7, 69, 69.1, 69.2, 88, 91, 120, 122, 150

[56] References Cited

U.S. PATENT DOCUMENTS

| | | | |
|---|---|---|---|
| 3,219,749 | 11/1965 | Schuster et al. | 152/902 X |
| 3,436,819 | 4/1969 | Lunine | 174/68.5 X |
| 3,471,348 | 10/1969 | Shaheen et al. | 174/68.5 X |
| 3,471,631 | 10/1969 | Quintana | 156/654 X |
| 4,037,047 | 7/1977 | Taylor | 156/629 X |
| 4,663,208 | 5/1987 | Ninomiya et al. | 428/138 |
| 4,710,419 | 12/1987 | Gregory | 29/846 X |

FOREIGN PATENT DOCUMENTS 0183936 6/1986 European Pat. Off. .
1160519 1/1964 Fed. Rep. of Germany .

*Primary Examiner*—William A. Powell
*Attorney, Agent, or Firm*—Hill, Van Santen, Steadman & Simpson

[57] ABSTRACT

As opposed to standard circuit board fabrication techniques, whereby plated holes are commonly bored through all the layers of a multilayer board, the circuit board for a hearing aid according to the invention is fabricated by alternatingly forming plated holes in subpackets of the circuit board and then joining together the subpackets until the completed multilayer board is bonded together. The circuit board can be provided with plated internal holes, plated blind holes as well as standard through holes. An especially high component density on the two surfaces of the circuit board is acheived, as well as the fabrication of extremely thin and flexible multilayer circuit boards.

16 Claims, 3 Drawing Sheets

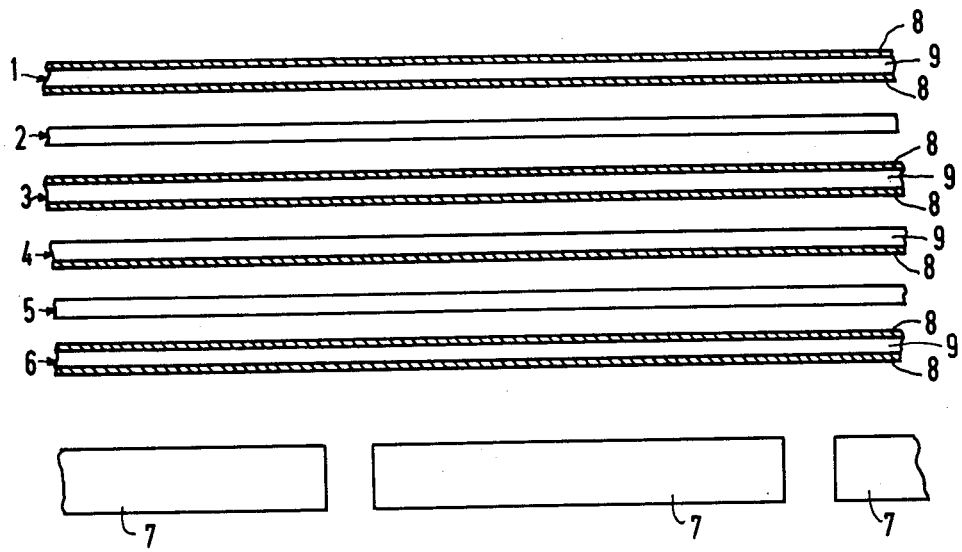
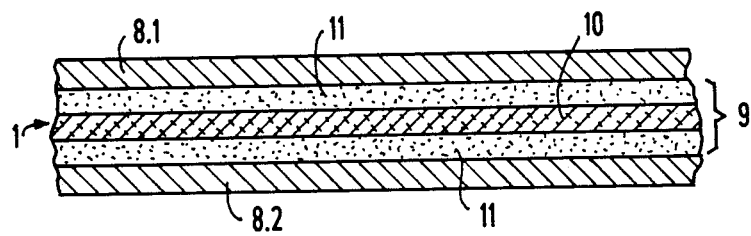
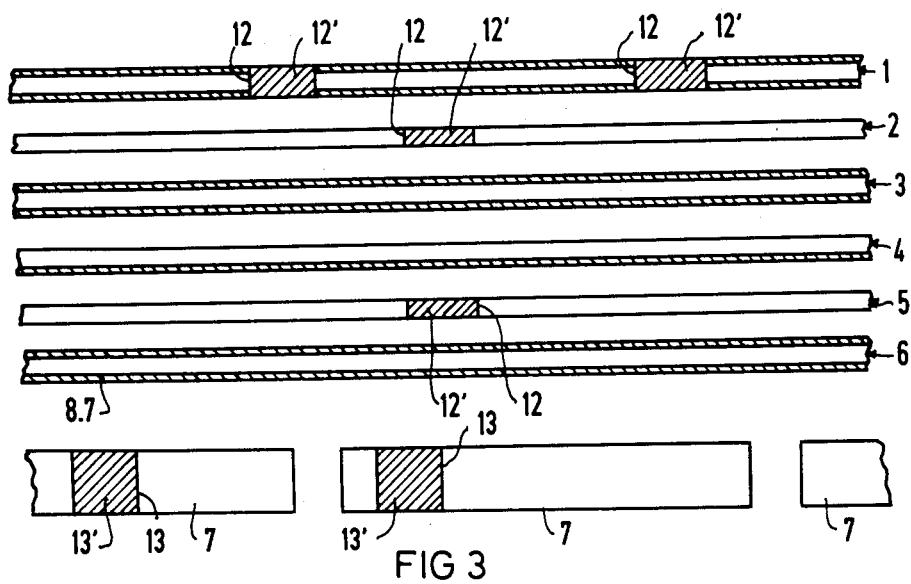

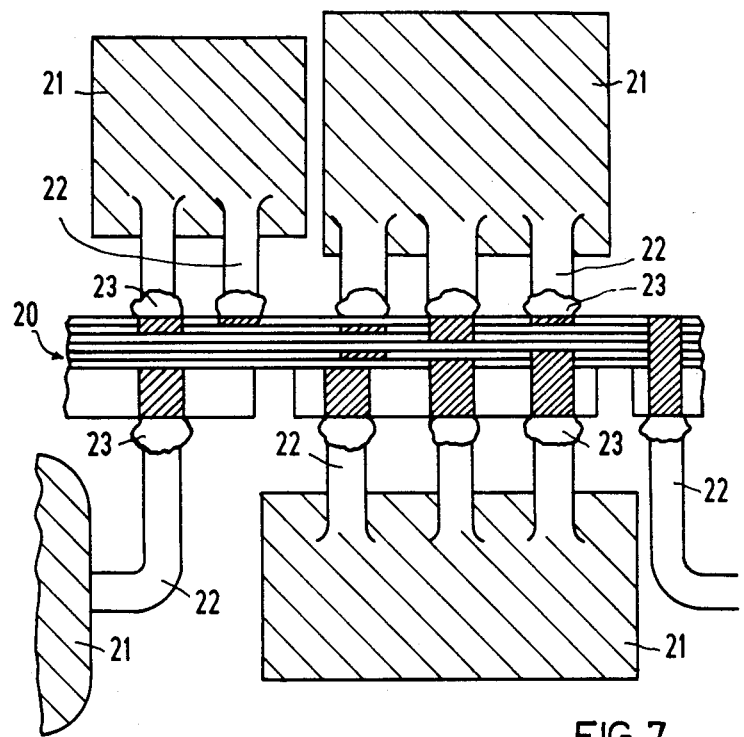
FIG 7
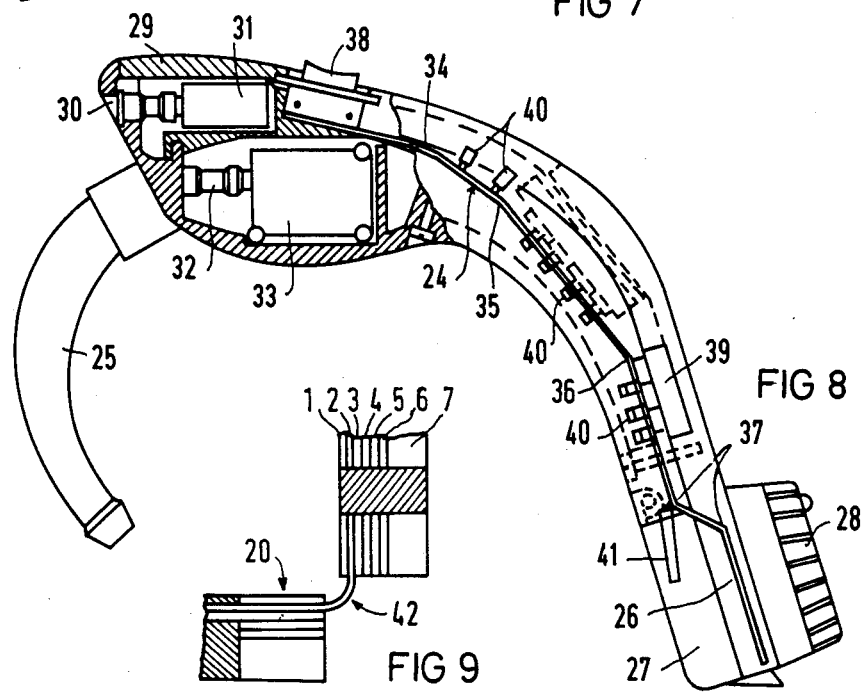
FIG 8
FIG 9

MANUFACTURING MINIATURE HEARING AID HAVING A MULTI-LAYER CIRCUIT ARRANGEMENT

BACKGROUND OF THE INVENTION

Field of the Invention

The present invention relates to a miniature hearing aid having a multilayer circuit arrangement.

Description of the Invention

Multilayer circuit boards are often utilized in areas of technology, where the manufactured products are very small in size. The design of small electronic products usually calls for printed board assemblies which are themselves as small as possible, so as to use as little of the minimal space within the product as possible. In hearing aid technology, for example, circuit boards are constructed such that they, together with the components mounted thereon, require minimum space within the hearing aid housing. Furthermore, it is advantageous if flexible circuit boards are used, so that they can be bent to fit the irregular interior space of the housing.

A number of circuit boards have been developed which only partially fulfill the requirements described above. For example, German patent application No. 27 24 399 (corresponds to U.S. Pat. No. 4,037,047) describes a three to ten layer circuit board with connection appendages of limited flexibility. The circuit boards themselves, however, are not adapted for use in very small products. Their circuitry connections make inefficient use of space, in that they are formed by plated through holes. A standard practice in the industry for several years, the process of forming plated through holes encompasses puncturing holes through all the layers of a circuit board, even when electrical connections are to be established, for example, only between on outer layer and an interior layer. In such a case, the through hole opens onto the other outer layer, but cannot be used for further connections. Especially if components are mounted on the circuit board, the resulting through holes lead to an inefficient component distribution. The component density cannot be maximized.

Contraves AG, a Swiss Corporation, proposes a partial solution to this problem in a European patent application No. 0 183 936 and in their advertisement: Bulletin H102d8603CZ. The component density is increased by providing blind holes as well as through holes for electrically connecting the various layers of the circuit board. A maximum density can, however, still not be achieved, since interior layers are connected by drilling from the outside through at least one outer layer. This process has a further shortcoming, since boring blind holes in multilayer boards requires relatively thick layers. Even when working with utmost precision, the insulating sheets between the conductive layers must be sufficiently thick (approximately 125 μm) to provide the necessary drilling tolerances. This, in turn, leads to non-flexible circuit boards, unsuited for hearing aids.

German patent application No. 1 160 519 and U.S. Pat. No. 3,436,819 also describe methods for manufacturing multilayer circuit boards. Circuit boards produced by these methods are, however, also rigid. A further circuit board with flexible connectors, described in U.S. Pat. No. 3,471,348, similar to the board described in U.S. Pat. No. 4,037,047, is also too rigid to be used in modern hearing aids.

SUMMARY OF THE INVENTION

It is the object of the present invention to provide a hearing aid with a multilayer circuit arrangement, which allows for mounting electrical components in an especially space-saving manner, and additionally providing a multilayer circuit arrangement for said hearing aid, which is sufficiently flexible to be adapted to the small interior of a hearing aid housing.

According to the present invention a miniature hearing aid having a multilayer circuit arrangement is provided comprising a plurality of layers including conducting foils, adhesive, thin insulating sheets and/or substrates and additionally a given number of plated blind holes and/or plated internal holes, whereby said multilayer circuit arrangement is fabricated by alternatingly:

(a) joining together a predetermined number of said layers, thereby fashioning subpackets of said multilayer circuit arrangement; and (b) forming said holes in said multilayer circuit arrangement by producing holes in said subpackets, said subpackets comprising one or more of said layers, until said subpackets have been joined together to form said multilayer circuit arrangement, such that said multilayer circiut arrangement has, at least intermittently, the flexibility and bendability of a corresponding multilayer circuit arrangement having only plated through holes.

According to the invention, the fabrication steps involving drilling and plating are carried out intermittently while combining the layers initially into subpackets and then into a complete multilayer board. The electrical connections between the various layers can be formed using the familiar methods for producing plated through holes. Once the various subpackets have been joined together to form the multilayer circuit board, through holes may be drilled through the entire board as needed, to connect the two component mounting surfaces. The circuit boards produced in this manner comprise, as desired, plated through holes, plated blind holes, and plated internal holes. The blind and internal holes require no tolerances, thereby permitting the use of extremely thin insulating sheets, which are essential for producing flexible multilayer circuit boards.

The following and other objects, features and advantages of the invention will be apparent from the following more particular description of a preferred embodiment of the invention, as illustrated in the accompanying drawings.

BRIEF DESCRIPTION OF THE DRAWINGS

FIG. 1 is an enlarged cross section of conducting foils, insulating sheets and a substrate for producing, in this example, a 7-layered circuit board in accordance with the principles of the present invention.

FIG. 2 is an enlarged cross section through an insulating sheet coated with two conducting foils.

FIG. 3 is an enlarged cross section through the various layers of FIG. 1 through which appropriate through holes have been drilled and plated.

FIG. 7 is an enlarged cross section of a multilayer circuit board with densely mounted components according to the invention.

FIG. 8 is an enlarged view of a hearing aid comprising a multilayer flexible circuit board, according to the invention.

FIG. 9 illustrates a further preferred embodiment of the invention, whereby the number of layers of the multilayer circuit board has been reduced in the bending zone of the circuit board.

DETAILED DESCRIPTION OF THE PREFERRED EMBODIMENTS

Figure 4:
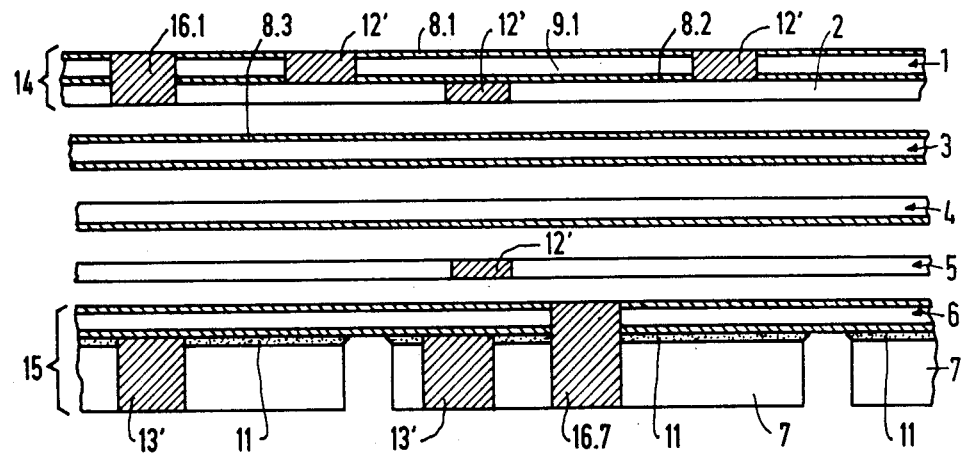
FIG. 4 illustrates subpackets of the multilayer circuit board, which comprise plated holes according to the invention.

In FIG. 1, a cross section of the various layers of a multilayer circuit board are shown prior to being joined together. In order to fully describe the process for producing a multilayer circuit board according to the invention, the fabrication of a 7-layer circuit board will be described below. The circuit board comprises seven layers for illustrative purposes only however. In the case of hearing aids, for example, it is usually preferable to use circuit boards with fewer layers, in order to ensure maximum flexibility.

The individual layers 1 through 7 of the circuit board of FIG. 1 comprise foils 1, 3, 6, laminated with copper on both sides, a foil 4, laminated only on one side, unlaminated insulating foils 2, 5 and a stabilizing substrate 7 made of epoxy resin. The foils are manufactured by means of known processes, by which copper coatings 8 are glued or pressed onto a base 9. Such foils are commonly available on the market.

FIG. 2 is an enlarged cross section of such a foil 1. It comprises a polyimide layer 10, which is, for example, 25 μm thick, and adhesive layers 11, each approximately 25 μm thick, applied onto both sides of layer 10. These adhesive layers 11 bind the non-conducting polyimide layer 10 with the conductive copper coatings 8.1 and 8.2. Each copper coating has a thickness of, for example, 382 μm.

As a first step in the fabrication, circuit paths are etched onto given copper coatings 8. Following this, through holes are bored through the individual layers 1 to 7 at locations wherever adjacent copper coatings must be electrically connected. In some cases it may be preferable to drill the holes before etching the circuit paths. In either case, the holes 12 are thereafter filled with a conducting material such as copper or tin. The plated holes 12' are shown in FIG. 3. Holes 13 are additionally formed at desired locations in the substrate 7. The plated holes have the reference number 13' in FIG. 3. The plated holes 13' form the electrical connection between the conductive coating 8.7 and electrical components mounted on the completed circuit board.

During the following step in the fabrication process, the individual layers 1 to 7 are joined together into subpackets. FIG. 4 illustrates two such subpackets 14 and 15. Again, in arbitrary order, the conductive layers on the subpackets are etched and through holes are bored through the subpackets and contacted at locations where the circuits paths of differing foils are to be electrically connected with each other. For example, the plated hole 16.1 passes through the layers 8.1, 9.1, 8.2, 2 of subpacket 14, thereby contacting circuit paths on coatings 8.1 and 8.3 once layer 3 is coupled to subpacket 14. If the conductive coating 8.2 should not be contacted with the circuit patterns on coatings 8.1 and 8.3 at location 16.1, the circuit paths of coating 8.2 will circumvent location 16.1. Plated hole 16.7 is also produced in this manner.

Figure 5:
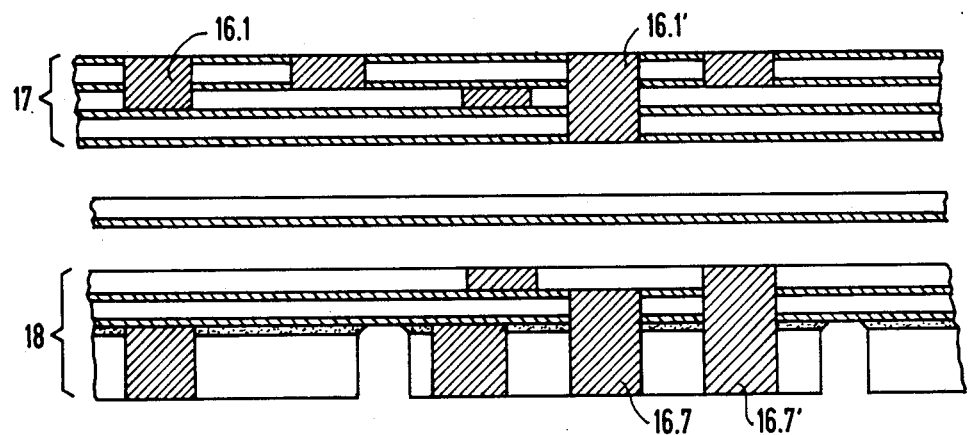
FIG. 5 illustrates the subpackets of FIG. 4 joined to form further packets, which have been drilled and plated.
Figure 6:
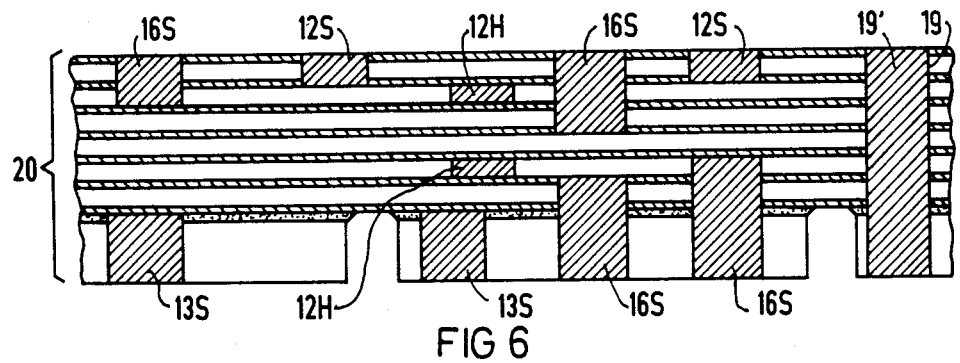
FIG. 6 illustrates a multilayer circuit board, which comprises a given number of plated through holes, plated pocket holes and plated embedded holes, according to the invention.

Further layers are then affixed to the subpackets to form new packets 17, 18, which are thereafter etched and drilled, to form plated holes 16.1', 16.7', which contact further conductive coatings (compare FIG. 4 and 5). These fabrication steps are performed alternatingly until a complete circuit board, such as the one shown in FIG. 6 has been produced. Plated through holes 19, running through all layers of the circuit board, can then be fashioned as needed, in order to electrically connect the outermost conductive coatings or to directly connect components mounted on opposite faces of the circuit board.

Although all the plated holes are formed as through holes, the resulting finished circuit board also comprises plated internal holes 12H and plated blind holes 12S, 13S, 16S. These internal and blind holes end precisely with the respective conductive coating to be contacted. They do not pass into the following insulating layer, as do the blind holes in the prior art. As a result, extremely thin polyimide layers can be used to insulate the conductive coatings from one another.

In FIG. 7 the connecting pins 22 of components 21 are soldered onto a multilayer circuit board 20 at soldering points 23. The component density is especially high, since the components can be attached, for example, directly across from one another. The type of component used can be varied according to need. For example, in some cases, it might be more cost effective to utilize components without connecting pins. In any case, the present invention makes a very dense component distribution on the circuit board possible.

FIG. 8 shows a behind-the-ear hearing aid according to the invention in which, for example, a 3-layer circuit board 24 has been mounted. The hearing aid also comprises a hook 25 at one end and a battery compartment 26 with a cover 27 and a volume control 28 at the other end. The end with the hook 25 also comprises a sound opening 30 in the housing 29, a microphone 31, an acoustic duct 32 and a transducer 33. The circuit board 24 is bent at flexible locations 34, 35, 36, 37. Components mounted thereon include a switch 38, an amplifier 39, further components 40 and a battery spring 41.

The flexibility of the circuit boards can be increased by reducing the number of layers in those areas which are to be bent. Bending zones 42 reduced to, for example, a single layer may be particularly desirable as shown in FIG. 9.

Having thus described the invention with particular reference to the preferred forms thereof, it will be obvious to those skilled in the art to which the invention pertains, after understanding the invention, that various changes and modifications may be made therein without departing from the spirit and scope of the invention as defined by the claims appended hereto.

What is claimed is:

1. A method for manufacturing a miniature hearing aid having a plurality of components and a multi-layer circuit board contained in a housing, said method comprising the steps of:
   (a) drilling through holes at selected locations in at least some of a plurality of unassembled layers;
   (b) combining a set of said layers in registry to form a subpacket;
   (c) drilling through holes at selected locations in said subpacket;

(d) adding at least a further one of said layers to the drilled subpacket;

(e) drilling through holes in the combination of said subpacket and said at least one further layer;

(f) repeating steps (d) and (e) until a circuit board of desired thickness and hole density is completed, said circuit board having a plurality of exposed holes, and;

(g) electrically connecting at least some of said plurality of components to said exposed holes of said circuit board.

2. A method as claimed in claim 1, wherein step (d) is further defined by the steps of:

combining a further set of said layers in registry to form a further subpacket;

drilling through holes at selected locations in said further subpacket; and adding the drilled further subpacket to the drilled subpacket, and wherein step (e) is further defined by:

drilling through holes in the combination of said subpacket and said further subpacket.

3. A method as claimed in claim 1, wherein said layers are selected from the group consisting of:

conducting foil layers, insulating layers, and substrates, and wherein step (b) is further defined by combining a set of said layers in registry in a selected sequence to form a subpacket, and wherein step (d) is further defined by adding at least a further selected one of said layers to the drilled subpacket.

4. A method as claimed in claim 1, wherein at least one of said layers is a conducting foil layer, and comprising the additional step of etching a circuit path in said conductive foil layer before combining said conductive foil layer with other layers.

5. A method as claimed in claim 1, wherein step (b) is further defined by:

combining fewer of said layers in registry at selected locations in said circuit board to form a subpacket to create a flexible zone in said circuit board.

6. A method as claimed in claim 1, wherein step (d) is further defined by:

adding fewer of said layers to the drilled subpacket at selected locations in said circuit board to create a flexible zone in said circuit board.

7. A method as claimed in claim 1, wherein the completed circuit board has two opposed faces, and comprising the additional step following step (f) of generating means for electrically and mechanically connecting said components on at least one of said faces of said circuit board.

8. A method for manufacturing a miniature hearing aid having a plurality of components and multi-layer circuit board contained in a housing, said method comprising the steps of:

(a) drilling through holes at selected locations in at least some of a plurality of unassembled layers;

(b) dividing said layers into a plurality of sets and arranging layers in registry in any set containing more than one layer;

(c) drilling through holes at selected locations in any of said sets containing more than one layer;

(d) combining two selected sets in registry to form a set combination;

(e) drilling through holes at selected locations in said set combination;

(f) combining a further set with said set combination to form a further set combination;

(g) drilling through holes at selected locations in said further set combination; and (h) repeating steps (f) and (g) until a circuit board of desired thickness and hole density is completed, said circuit board having a plurality of exposed holes, and;

(i) electrically connecting at least some of said plurality of components to said exposed holes of said circuit board.

9. A miniature hearing aid comprising:

(a) a circuit board manufactured by drilling through holes at selected locations in at least some of a plurality of unassembled layers, (b) combining a set of said layers in registry to form a subpacket, (c) drilling through holes at selected locations in said subpacket, (d) adding at least a further one of said layers to the drilled subpacket, (e) drilling through holes in the combination of said subpacket and said at least one further layer, (f) repeating steps (d) and (e) until said circuit board is completed, said circuit board having a plurality of exposed holes;

a plurality of electrical components electrically connected to said exposed holes of said circuit board; and a housing in which said circuit board and said components are contained.

10. A method as claimed in claim 1, comprising the additional step of:

mounting said circuit board in said housing to conform to the shape of the housing by bending said circuit board in said housing at at least one location of said circuit board.

11. A method as claimed in claim 5, comprising the additional step of:

mounting said circuit board in said housing by bending said circuit board at least at said flexible zone.

12. A method as claimed in claim 10, comprising the additional step of:

mounting said circuit board in said housing by bending said circuit board at least at said flexible zone.

13. A method as claimed in claim 12, comprising the additional step of:

mounting said circuit board in said housing to conform to the shape of the housing by bending said circuit board in said housing at at least one location of said circuit board.

14. A miniature hearing aid as claimed in claim 13, further comprising:

means for mounting said circuit board in said housing bent at at least said one location of said circuit board to conform to the shape of said housing.

15. A miniature hearing aid comprising:

a housing;

a plurality of components disposed in said housing;

a circuit board in said housing to which at least some of said components are electrically connected, said circuit board having at least one section consisting of a section having a first selected number of layers with blind and through holes selectively drilled therein and at least one additional section consisting of a second selected number of layers less than said first selected number of layers; and means for mounting said circuit board in said housing bent at said additional section.

16. A miniature hearing aid as claimed in claim 15, wherein said first and second sections of said circuit board have at least one common layer.

* * * * *